(12) United States Patent
Huang

(10) Patent No.: US 10,591,788 B2
(45) Date of Patent: Mar. 17, 2020

(54) ARRAY SUBSTRATE AND LIQUID CRYSTAL DISPLAY PANEL

(71) Applicant: Wuhan China Star Optoelectronics Semiconductor Display Technology Co., Ltd., Wuhan, Hubei (CN)

(72) Inventor: Cui Huang, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 137 days.

(21) Appl. No.: 15/749,233

(22) PCT Filed: Nov. 17, 2017

(86) PCT No.: PCT/CN2017/111637
§ 371 (c)(1),
(2) Date: Jan. 31, 2018

(87) PCT Pub. No.: WO2019/010893
PCT Pub. Date: Jan. 17, 2019

(65) Prior Publication Data
US 2019/0011756 A1     Jan. 10, 2019

(30) Foreign Application Priority Data

Jul. 10, 2017 (CN) .......................... 2017 1 0556715

(51) Int. Cl.
*G02F 1/1345* (2006.01)
*G02F 1/1333* (2006.01)
(Continued)

(52) U.S. Cl.
CPC ...... *G02F 1/13452* (2013.01); *G02F 1/13458* (2013.01); *G02F 1/133345* (2013.01);
(Continued)

(58) Field of Classification Search
CPC ............... G02F 1/1345; G02F 1/13452; G02F 1/13458; H01L 27/3276
See application file for complete search history.

(56) References Cited

U.S. PATENT DOCUMENTS

2002/0071087 A1* 6/2002 Suzuki ................. G02F 1/1345
349/155
2018/0149901 A1* 5/2018 Park ..................... G02F 1/13452

FOREIGN PATENT DOCUMENTS

| CN | 1264494 A | 8/2000 |
| CN | 106405892 A | 2/2017 |

(Continued)

*Primary Examiner* — Jessica M Merlin
(74) *Attorney, Agent, or Firm* — Andrew C. Cheng

(57) ABSTRACT

The present invention provides an array substrate, which comprises a peripheral region and a plurality of conductive terminals disposed in the peripheral region. The peripheral region comprises a base substrate and a buffer layer, an insulating layer, and an interlayer dielectric layer orderly-overlapping disposed on the substrate. The array substrate further comprises grooves extending from the interlayer dielectric layer to the base substrate. Each of the conductive terminals comprises a first terminal, a crimping terminal which comprises a crimping layer and a second terminal disposed on the crimping layer, and a plurality of conductive particles. The first terminal comprises a connection section and an extension section, which is connected with the connection section. The second terminal is inserted into the groove. The conductive particles are uniformly sealed in a gap, so as to achieve the conduction between the first terminal and the second terminal.

16 Claims, 5 Drawing Sheets

(51) Int. Cl.
*H01L 51/00* (2006.01)
*H01L 27/32* (2006.01)

(52) U.S. Cl.
CPC ...... *H01L 27/3276* (2013.01); *H01L 51/0097* (2013.01); *H01L 2251/5338* (2013.01)

(56) References Cited

FOREIGN PATENT DOCUMENTS

| | | | |
|---|---|---|---|
| CN | 107153307 A | | 9/2017 |
| JP | 2003264352 A | | 9/2003 |
| JP | 2012049398 A | * | 3/2012 |
| JP | 2012049398 A | | 3/2012 |
| JP | 2017004715 A | | 1/2017 |
| KR | 20090098076 A | | 9/2009 |

* cited by examiner

ARRAY SUBSTRATE AND LIQUID CRYSTAL DISPLAY PANEL

BACKGROUND OF THE APPLICATION

This application claims the priority of an application No. 2017105567159 filed on Jul. 10, 2017, entitled "ARRAY SUBSTRATE AND LIQUID CRYSTAL DISPLAY PANEL", the contents of which are hereby incorporated by reference.

FIELD OF APPLICATION

The present disclosure relates to the field of liquid crystal display technology, and particularly to an array substrate and a liquid crystal display panel.

DESCRIPTION OF PRIOR ART

The conductive terminals of the non-display area of the display panel are usually formed by crimping the conductive particles with the metal wires led out from the display area and the contacts of the chip. Conventionally, the contacts are usually a protrusion structure. When crimping the metal wires, the flow of the resin in the conductive particles causes the conductive particles to gather in the gap between the contacts and the metal wires, and the gap between where the contacts and the metal wires are crimped has no conductive particles inside, but make the adjacent terminals be conducted, resulting in short circuit.

SUMMARY OF THE APPLICATION

The present invention provides an array substrate which is able to prevent from short circuit, due to the unstable conductive particles between the conductive terminals.

The present invention also provides a liquid crystal display.

An array substrate of the present invention comprises a peripheral region and a plurality of conductive terminals disposed in the peripheral region. The peripheral region comprises a base substrate and a buffer layer, an insulating layer, and an interlayer dielectric layer orderly-overlapping disposed on the substrate. The array substrate further comprises grooves extending from the interlayer dielectric layer to the base substrate.

Each of the conductive terminals comprises a first terminal, a crimping terminal which comprises a crimping layer and a second terminal disposed on the crimping layer, and a plurality of conductive particles. The first terminal comprises a connection section laminated on a surface of an inner wall of the groove, and an extension section extending from the inner wall to the interlayer dielectric layer of a peripheral of the groove, which is connected with the connection section. A cross-section of the second terminal is the same as a cross-section of the groove. The crimping layer is opposite to the extension section of the first terminal. The second terminal is inserted into the groove. The conductive particles are uniformly sealed in a gap between the connection section of the first terminal and the second terminal, and a gap between the crimping layer and the extension section, so as to achieve the conduction between the first terminal and the second terminal.

Wherein a part or entire of the inner wall of the groove is an inclined surface inclined away from inner of the groove.

Wherein the cross-section of the groove is V-shaped, the second terminal is a protrusion protruding from the crimping layer.

Wherein the cross-section of the groove is an inverted trapezoid, the second terminal is a protrusion protruding from the crimping layer, with a cross-section is an inverted trapezoid.

Wherein the cross section of the groove is arc-shaped, and the inner wall is an arc-shaped concave surface; the second terminal is a protrusion protruding from the crimping layer, with a cross-section is arc-shaped.

Wherein the inner wall of the groove comprises inclined groove sidewalls and a groove bottom wall formed by the base substrate, the connection section is laminated on the groove sidewalls and the groove bottom wall and a portion of the connection section laminated on the sidewalls of the groove and the sidewalls of the groove have the same tilt angle.

Wherein the first terminal is a metal layer.

Wherein the crimping terminal forms contact of a chip.

A liquid crystal display panel of the present invention comprises a display area and a non-display area. The liquid crystal display panel further comprises the array substrate. The peripheral region of the array substrate is within the non-display area.

Wherein the liquid crystal display panel is a flexible organic light-emitting diode (OLED) or liquid crystal display (LCD).

In the array substrate of the present invention, the first terminal on the base substrate extends longitudinally with a depth to the base substrate, and the connection section is transversally disposed with a slope arrangement, thereby increasing the contact area of the entire terminal. When the crimping terminal is crimped, the area of a crimping gap among the crimping layer, the second terminal and the first terminal is increased, the contact area of the gap where the conductive particles are located is increased, the frequency of the flow of the conductive particles to the gaps of the crimping terminal and the first terminal is restricted, the uniformity and stability of the conductive particles within the crimping gap is enhanced.

BRIEF DESCRIPTION OF THE DRAWINGS

In order to describe the technical solutions in the embodiments of the present application or in the conventional art more clearly, the accompanying drawings required for describing the embodiments or the conventional art are briefly introduced. Apparently, the accompanying drawings in the following description only show some embodiments of the present application. For those skilled in the art, other drawings may be obtained based on these drawings without any creative work.

DETAILED DESCRIPTION OF THE PREFERRED EMBODIMENTS

The technical solutions in the embodiments of the present invention will be described clearly and completely hereinafter with reference to the accompanying drawings in the embodiments of the present invention. Apparently, the described embodiments are merely some but not all embodiments of the present invention. All other embodiments obtained by a person of ordinary skill in the art based on the embodiments of the present invention without creative efforts shall fall within the protection scope of the present invention. The patterning process described in the present application comprises a patterning process such as film forming, developing, exposing, etching and the like.

The present invention provides an array substrate, which comprises a peripheral region and a plurality of conductive terminals disposed in the peripheral region. The peripheral region comprises a base substrate and a buffer layer, an insulating layer, and an interlayer dielectric layer orderly-overlapping disposed on the substrate. The array substrate further comprises grooves extending from the interlayer dielectric layer to the base substrate.

Each of the conductive terminals comprises a first terminal, a crimping layer, a second terminal disposed on the crimping layer, and a plurality of conductive particles. The first terminal comprises a connection section laminated on a surface of an inner wall of the groove, and an extension section extending from the inner wall to the interlayer dielectric layer of a peripheral of the groove, which is connected with the connection section. A cross-section of the second terminal is the same as a cross-section of the groove. The crimping layer is opposite to the extension section of the first terminal. The second terminal is inserted into the groove. The conductive particles are uniformly sealed in a gap between the connection section of the first terminal and the second terminal, and a gap between the crimping layer and the extension section, so as to achieve the conduction between the first terminal and the second terminal. A part or entire of the inner wall of the groove is an inclined surface inclined away from inner of the groove. The smaller the angle of the inclined surface is, the larger the area of the first terminal is, which is favorable for the contact performance of the first terminal.

Figure 1:
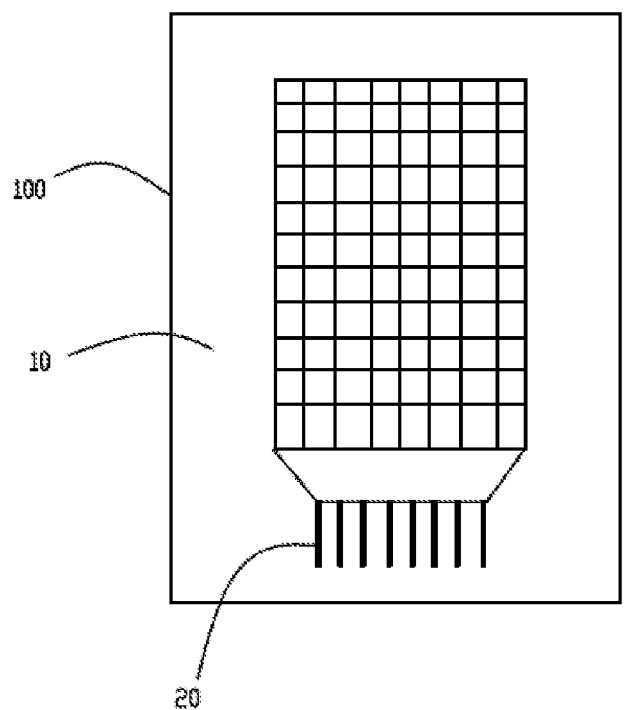
FIG. 1 is a plan view of an array substrate according to an embodiment of the present invention.
Figure 2:
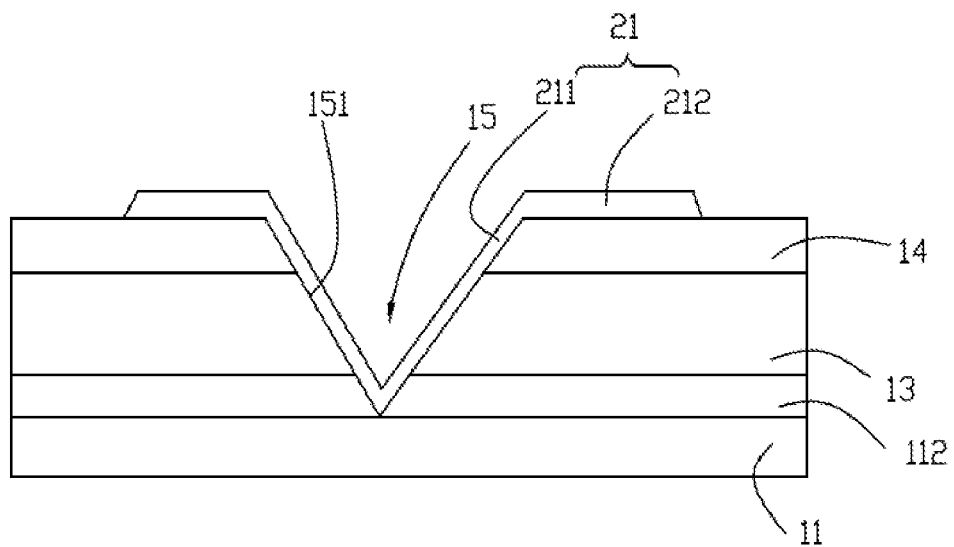
FIG. 2 is a schematic side view of an inner side of a conductive terminal of an array substrate including a first terminal according to an embodiment of the present invention.

Please refer to FIGS. 1-2, the present invention provides an array substrate 100, which comprises a peripheral region 10 and a plurality of conductive terminals 20 disposed in the peripheral region 10. The peripheral region 10 comprises a base substrate 11 and a buffer layer 112, an insulating layer 13, and an interlayer dielectric layer 14 orderly-overlapping disposed on the substrate 11. The array substrate further comprises grooves 15 extending from the interlayer dielectric layer 14 to the base substrate 11. The base substrate 11 is made of flexible material. The array substrate further comprises an intermediate functional region (not shown) for providing a semiconductor layer, a source/drain electrode, an electrode, and the like. The base substrate 11 and the buffer layer 112, the insulating layer 13, and the interlayer dielectric layer 14 orderly-overlapping disposed on the substrate 11, extend from a middle region of the array substrate.

Figure 3:
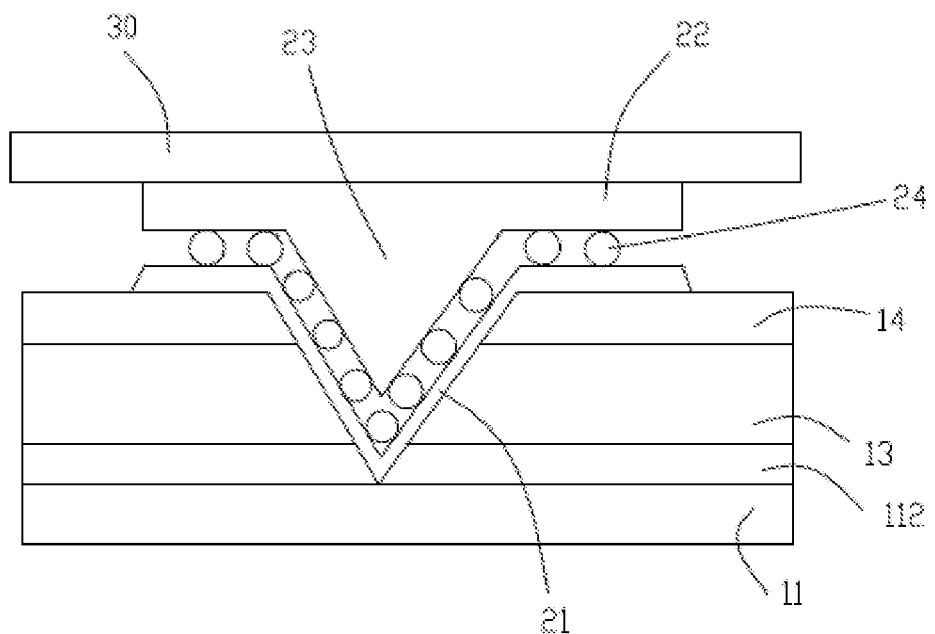
FIG. 3 is a schematic side view of the inner side of the conductive terminal shown in FIG. 2.

Please refer to FIG. 3, in the embodiment of the present invention, a cross-section of the groove 15 is V-shaped, the groove 15 comprises two opposite groove sidewalls 151 and opposite end sidewalls. The groove sidewalls and the end sidewalls constitute a bar-shaped groove body. The groove sidewalls 151 and the opposite end sidewalls are inclined away from inner side of the groove 15 to form an inclined surface. Each of the conductive terminals 20 comprises a first terminal 21, a crimping terminal and a plurality of conductive particles 24. The crimping terminal comprises a crimping layer 22 and a second terminal 23 disposed on the crimping layer 22. The crimp terminal is a contact on the chip package or the integrated chip or the chip. In this embodiment, the contact is extended from the chip 30. The first terminal 21 is a metal layer. The first terminal 21 may be formed in the same layer as the channel process of the source/drain electrodes on the array substrate, or may be formed separately.

The first terminal 21 comprises a connection section 211 laminated on an surface of an inner wall of the groove 15, and an extension section 212 extending from the inner wall to the interlayer dielectric layer 14 of a peripheral of the groove 15, which is connected with the connection section 211. A portion of the first terminal 21 located in the groove has the same shape as the groove, and the extension 212 disposed on the interlayer dielectric layer 14 surrounds the groove 15. Since the groove sidewalls 151 and the end sidewall are both inclined surfaces, the area of the connecting portion 212 formed on both the groove side wall 151 and the end side wall increases compared with that of a vertical surface, so that the effective contacting area of the first terminal 21 can be increased.

A cross-section of the second terminal 23 is the same as a cross-section of the groove 15; the second terminal 23 is a protrusion protruding from the crimping layer 22. When the crimping terminal and the first terminal 21 are crimped, the crimping layer 22 is opposite to the extension section 212 of the first terminal 21. The second terminal 23 is inserted into the groove 15. The conductive particles 24 are uniformly sealed in a gap between the connection section 211 of the first terminal 21 and the second terminal 23, and a gap between the crimping layer 22 and the extension section 212, so as to achieve the conduction between the first terminal 21 and the second terminal 23.

In the array substrate of the present invention, the first terminal 21 on the base substrate 11 extends longitudinally with a depth to the base substrate 11, and the connection section is transversally disposed with a slope arrangement, thereby increasing the contact area of the entire terminal. When the crimping terminal is crimped, the area of a crimping gap among the crimping layer 22, the second terminal 23 and the first terminal 21 is increased; the contact area of the gap where the conductive particles are located is increased. Therefore, the contact area where the conductive particles 24 are located is increased, and at least one conductive particle 24 can be accommodated in the depth direction, so that the frequency of the flow of the conductive particles 24 to the gaps of the crimping terminal and the first terminal is restricted, the uniformity and stability of the conductive particles within the crimping gap is enhanced, thereby improving the connection stability between the first terminal 21 and the second terminal 23.

Figure 4:
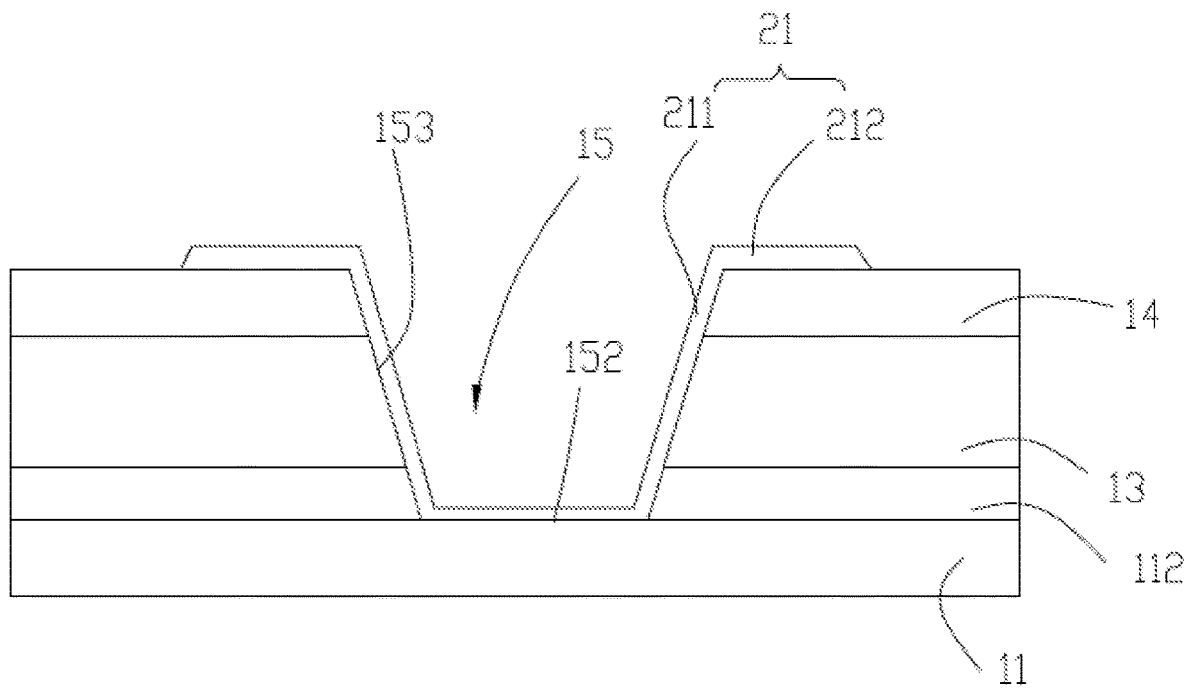
FIG. 4 is a schematic side view of an inner side of a conductive terminal of an array substrate including a first terminal according to an embodiment of the present invention.
Figure 5:
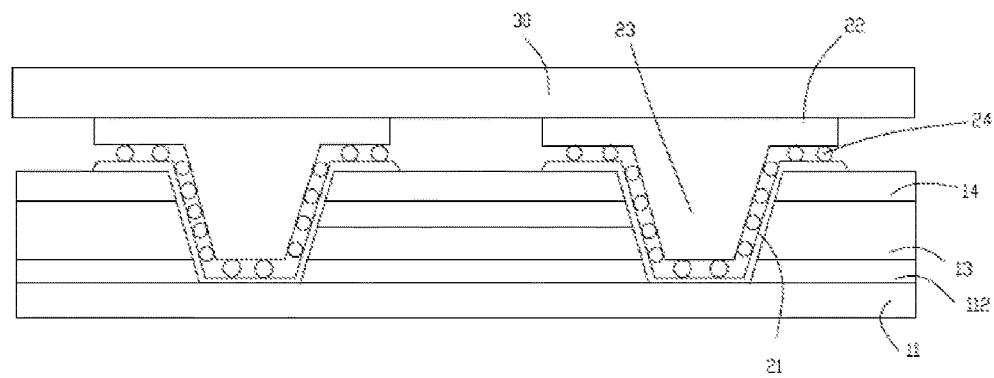
FIG. 5 is a schematic side view of the inner side of the conductive terminal shown in FIG. 4.
Figure 6:
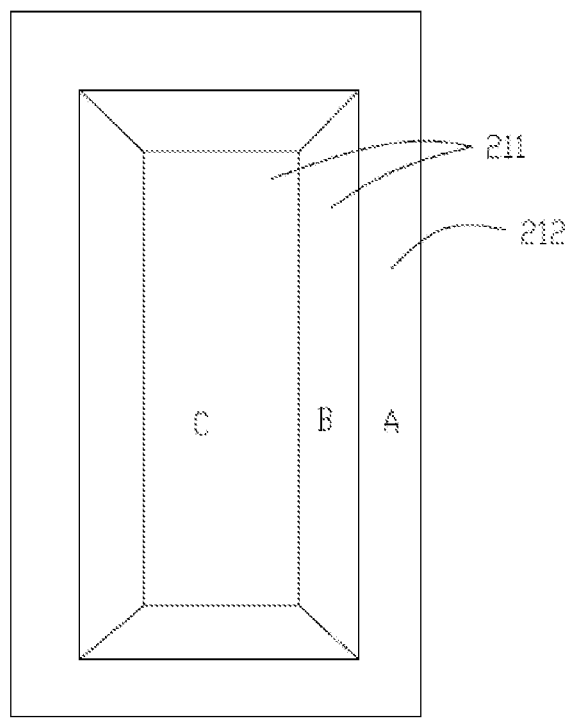
FIG. 6 is a top view of the first terminal shown in FIG. 4.

Please refer to FIGS. 4-5, in another embodiment of the present invention, the difference between the present embodiment and the above embodiment is that the cross-section of the groove 15 is an inverted trapezoid and comprises a groove bottom wall 152 formed on the base substrate and a groove sidewall 153 disposed around the bottom wall 152. The groove sidewall 153 is an inclined surface, and the second terminal 23 is a protrusion, with a cross-section is an inverted trapezoid, protruding from the crimping layer 22. The connection section 211 of the first terminal 21 varies with the shape of the cross-section of the groove during the manufacturing process. The connection section 211 of the present embodiment is laminated on the groove bottom wall 152 and the groove sidewall 153, and a part of the connection section 211 laminated on the side wall and the sidewall 153 have the same tilt angle, so as to ensure the maximum area of the connection section. The opposite of the second terminal of the crimping terminal and the connecting section 211 of the first terminal 21 forms a crimping gap for receiving the conductive particles 24. The crimping layer 22 and the extension section oppositely form a gap for accommodating the conductive particles 24. As shown in FIG. 6, which is a top view of the first terminal 21 of the present embodiment, which comprises three regions (A, B and C), the B region and the C region are the top view of the connection section 211 of the first terminal 21, the A region is a top view of the extension portion 212. When the tilt angle of the connection portion 211 is smaller, the area of the B region is larger, which increases the contact area of the first terminal 21.

Figure 7:
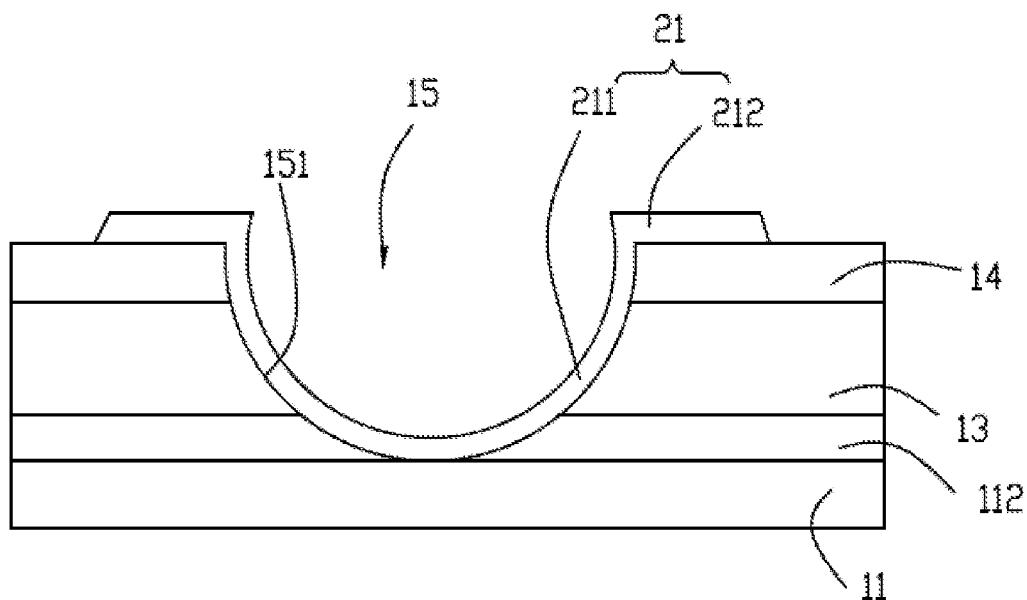
FIG. 7 is a schematic side view of an inner side of a conductive terminal of an array substrate including a first terminal according to an embodiment of the present invention.
Figure 8:
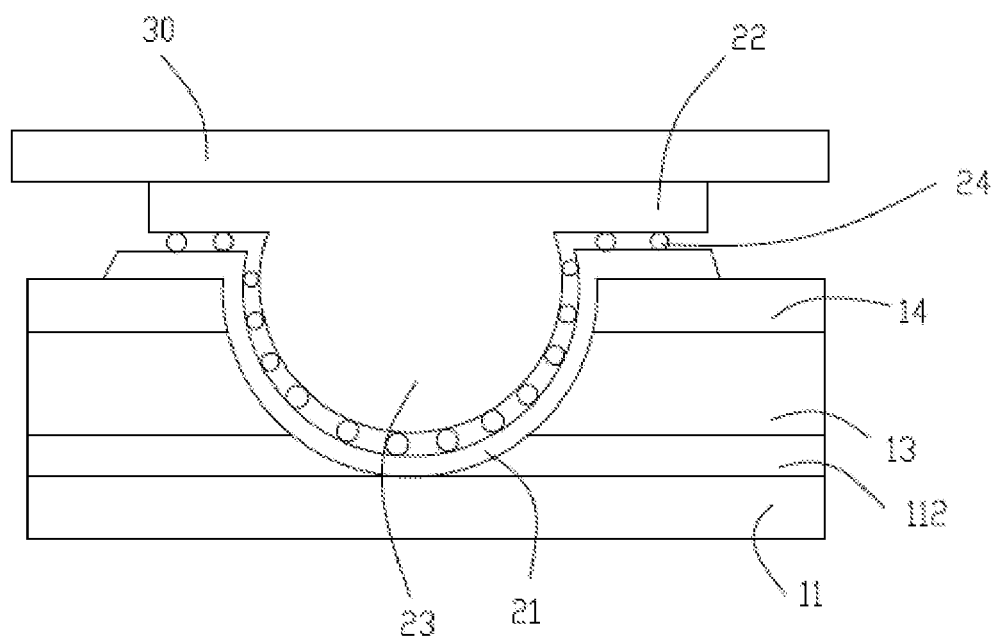
FIG. 8 is a schematic side view of the inner side of the conductive terminal shown in FIG. 7.

Please refer to FIGS. 7-8, in another embodiment of the present invention, the difference between the present embodiment and the above embodiment is that the cross-section of the groove 15 is arc-shaped concave surface, the connection section 211 of the first terminal 21 is arc-shaped, the inner wall is an arc-shaped concave surface. The second terminal 23 is a protrusion protruding from the crimping layer 22, with a cross-section is arc-shaped. When the crimping terminal is crimped with the first terminal 21, a crimping gap is formed between the arc-shaped second terminal 23 and the connection section 211 of the first terminal 21 for accommodating the conductive particles 24. The crimping layer 22 and the extension section relatively form a gap for accommodating the conductive particles 24.

An embodiment of the present invention further provides a liquid crystal display panel, which comprises a display area, a non-display area, and the array substrate. A peripheral region of the array substrate is located in the non-display area. A chip provided with crimping terminals is a liquid crystal display driver chip. The liquid crystal display panel further comprises a display medium layer and an opposite substrate. A plurality of display elements (not shown) are disposed on the array substrate and the opposite substrate. The plurality of display elements are configured to generate an electric field for driving the display medium layer to perform image display. In this embodiment, the display medium layer is also described as an example of another display medium, such as an organic electroluminescent display (OLED). Of course, the display medium layer may alternatively be a liquid crystal molecular layer, that is, a liquid crystal display (LCD) or other display material in the present embodiment, but not limited thereto. The first terminal 21 is crimped with the crimping terminal and achieves the conduction between the array substrate, the opposite substrate, and the chip through the conduction of the conductive particles.

The buffer layer 112, the insulating layer 13, and the interlayer dielectric layer 14 of the array substrate are mainly made of SiO2 and SiNx. The first terminal 21 is crimped with the crimping layer of the crimping terminal and the second terminal 23 by crimping the contact of the chip. If, according to the conventional design, the metal wires are led out from the dielectric layer display area, then changing wires to the gate layer, the wire layer jumps back to the dielectric layer through a smaller via structure. Since the base substrate of the flexible OLED is usually a flexible polyimide (PI), its expansion rate is inconsistent with the metal layers (such as Ti/A/Ti), SiO2 and SiNx. The high temperature of the crimping process easily results cracking in the multilayer structure of the array substrate. The depth direction of the first terminal of the conductive terminal according to the present invention penetrates the insulating layer and the buffer layer directly to the base substrate, and the connection section is provided with a slope arrangement, which not only can eliminate the cracking phenomenon among multi-layer under the high temperature, but also stabilizes the stability of the conductive particles. It should be noted that, the drawings of the present invention are merely schematic diagrams, and it is normal that the size and shape may have size differences.

The embodiments of the present invention are described in detail above. Specific embodiments are used herein to describe the principles and implementation manners of the present invention. The description of the foregoing embodiments is merely used to help understand the method and core idea of the present invention. Meanwhile, that ordinary skill in the art, based on the idea of the present invention, may make some changes in the specific implementation manners and application scopes. To sum up, the contents of the present specification should not be construed as limiting the present invention.

What is claimed is:

1. An array substrate, comprising a peripheral region and a plurality of conductive terminals disposed in the peripheral region, wherein the peripheral region comprises a base substrate and a buffer layer, an insulating layer, and an interlayer dielectric layer orderly-overlapping disposed on the substrate, and further comprises grooves extending from the interlayer dielectric layer to the base substrate;

wherein each of the conductive terminals comprises a first terminal, a crimping terminal which comprises a crimping layer and a second terminal disposed on the crimping layer, and a plurality of conductive particles, the first terminal comprising a connection section laminated on an surface of an inner wall of each of the grooves, and an extension section extending from the inner wall to the interlayer dielectric layer of a peripheral of the groove, the extension section being connected with the connection section and comprising a part located on an upper surface of the interlayer dielectric layer;

a cross-section of the second terminal is the same as a cross-section of the groove, wherein the crimping layer is opposite to the extension section of the first terminal and has a part facing the part of the extension section of the first terminal that is located on the upper surface of the interlayer dielectric layer, the second terminal being inserted into the groove, the conductive particles being uniformly sealed in a gap between the connection section of the first terminal and the second terminal, and a gap between the crimping layer and the extension section, so as to achieve the conduction between the first terminal and the second terminal;

wherein a portion of the conductive particles is interposed between and electrically connected with the part of the extension section of the first terminal that is located on the upper surface of the interlayer dielectric layer and the part of the crimping layer that faces the part of the extension section of the first terminal that is located on the upper surface of the interlayer dielectric layer.

2. The array substrate according to claim 1, wherein a part or entire of the inner wall of the groove is an inclined surface inclined away from inner of the groove.

3. The array substrate according to claim 2, wherein the cross-section of the groove is V-shaped, the second terminal is a protrusion protruding from the crimping layer.

4. The array substrate according to claim 2, wherein the cross-section of the groove is an inverted trapezoid, the second terminal is a protrusion protruding from the crimping layer, with a cross-section is an inverted trapezoid.

5. The array substrate according to claim 2, wherein the cross section of the groove is arc-shaped, and the inner wall is an arc-shaped concave surface; the second terminal is a protrusion protruding from the crimping layer, with a cross-section is arc-shaped.

6. The array substrate according to claim 4, wherein the inner wall of the groove comprises inclined groove sidewalls and a groove bottom wall formed by the base substrate, the connection section is laminated on the groove sidewalls and the groove bottom wall and a portion of the connection section laminated on the sidewalls of the groove and the sidewalls of the groove have the same tilt angle.

7. The array substrate according to claim 1, wherein the first terminal is a metal layer.

8. The array substrate according to claim 1, wherein the crimping terminal forms contact of a chip.

9. A liquid crystal display panel, comprising a display area and a non-display area, wherein the liquid crystal display panel further comprises an array substrate, which comprises a peripheral region and a plurality of conductive terminals disposed in the peripheral region, wherein the peripheral region comprises a base substrate and a buffer layer, an insulating layer, and an interlayer dielectric layer orderly-overlapping disposed on the substrate, and further comprises grooves extending from the interlayer dielectric layer to the base substrate;

wherein each of the conductive terminals comprises a first terminal, a crimping terminal which comprises a crimping layer and a second terminal disposed on the crimping layer, and a plurality of conductive particles, the first terminal comprising a connection section laminated on a surface of an inner wall of each of the grooves, and an extension section extending from the inner wall to the interlayer dielectric layer of a peripheral of the groove, the extension section being connected with the connection section and comprising a part located on an upper surface of the interlayer dielectric layer;

a cross-section of the second terminal is the same as a cross-section of the groove, wherein the crimping layer is opposite to the extension section of the first terminal and has a part facing the part of the extension section of the first terminal that is located on the upper surface of the interlayer dielectric layer, the second terminal being inserted into the groove, the conductive particles being uniformly sealed in a gap between the connection section of the first terminal and the second terminal, and a gap between the crimping layer and the extension section, so as to achieve the conduction between the first terminal and the second terminal;

wherein a portion of the conductive particles is interposed between and electrically connected with the part of the extension section of the first terminal that is located on the upper surface of the interlayer dielectric layer and the part of the crimping layer that faces the part of the extension section of the first terminal that is located on the upper surface of the interlayer dielectric layer.

10. The liquid crystal display panel according to claim 9, wherein a part or entire of the inner wall of the groove is an inclined surface inclined away from inner of the groove.

11. The liquid crystal display panel according to claim 10, wherein the cross-section of the groove is V-shaped, the second terminal is a protrusion protruding from the crimping layer.

12. The liquid crystal display panel according to claim 10, wherein the cross-section of the groove is an inverted trapezoid, the second terminal is a protrusion protruding from the crimping layer, with a cross-section is an inverted trapezoid.

13. The liquid crystal display panel according to claim 10, wherein the cross section of the groove is arc-shaped, and the inner wall is an arc-shaped concave surface; the second terminal is a protrusion protruding from the crimping layer, with a cross-section is arc-shaped.

14. The liquid crystal display panel according to claim 12, wherein the inner wall of the groove comprises inclined groove sidewalls and a groove bottom wall formed by the base substrate, the connection section is laminated on the groove sidewalls and the groove bottom wall and a portion of the connection section laminated on the sidewalls of the groove and the sidewalls of the groove have the same tilt angle.

15. The liquid crystal display panel according to claim 9, wherein the first terminal is a metal layer.

16. The liquid crystal display panel according to claim 9, wherein the crimping terminal forms contact of a chip.

* * * * *